(12) United States Patent
Oda et al.

(10) Patent No.: US 6,319,849 B1
(45) Date of Patent: Nov. 20, 2001

(54) SEMICONDUCTOR DEVICE AND A PROCESS FOR FORMING A PROTECTIVE INSULATING LAYER THEREOF

(75) Inventors: Kouji Oda; Seiji Ohkura, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/228,272

(22) Filed: Jan. 11, 1999

Related U.S. Application Data

(62) Division of application No. 08/827,555, filed on Mar. 28, 1997, now Pat. No. 5,880,518.

(30) Foreign Application Priority Data

Sep. 10, 1996 (JP) ..................................... 8-239343

(51) Int. Cl.[7] ........................... H01L 21/31; H01L 21/469
(52) U.S. Cl. ............................................ 438/763; 438/766
(58) Field of Search .................................. 438/696, 698, 438/624, 763, 766

(56) References Cited

U.S. PATENT DOCUMENTS

| | | | |
|---|---|---|---|
| 5,069,747 | * 12/1991 | Cathey et al. | 437/238 |
| 5,104,482 | * 4/1992 | Monkowski et al. | 437/238 |
| 5,356,722 | * 10/1994 | Nguyen et al. | 427/569 |
| 5,399,533 | * 3/1995 | Pramanik et al. | 437/228 |
| 5,403,780 | * 4/1995 | Jain et al. | 437/195 |
| 5,420,075 | * 5/1995 | Homma et al. | 437/195 |
| 5,428,244 | 6/1995 | Segawa et al. | . |
| 5,461,254 | 10/1995 | Tsai et al. | . |
| 5,627,403 | 5/1997 | Bacchetta et al. | . |
| 5,880,518 | * 3/1999 | Oda et al. | 257/935 |

FOREIGN PATENT DOCUMENTS

| | | |
|---|---|---|
| 60-53051 | 3/1985 | (JP) . |
| 1-134935 | 5/1989 | (JP) . |
| 4-34936 | 2/1992 | (JP) . |
| 6-84812 | 3/1994 | (JP) . |
| 6-132542 | 5/1994 | (JP) . |
| 6-283509 | 10/1994 | (JP) . |
| 7-321105 | 12/1995 | (JP) . |

* cited by examiner

*Primary Examiner*—John F. Niebling
*Assistant Examiner*—Walter L. Lindsay, Jr.
(74) *Attorney, Agent, or Firm*—McDermott, Will & Emery

(57) ABSTRACT

A protective insulating film in a semiconductor device is formed in a multi-layer structure. A lower layer portion is constituted by an organic-silane-based silicon oxide film formed by a P-CVD process using organic silane and oxygen to improve step coverage. An upper layer portion is constituted by a silane-based silicon oxide film containing excess silicon in an amount greater than that in the stoichiometric composition and formed by a P-CVD process to improve moisture resistance.

19 Claims, 2 Drawing Sheets

FIG. 3  *PRIOR ART*
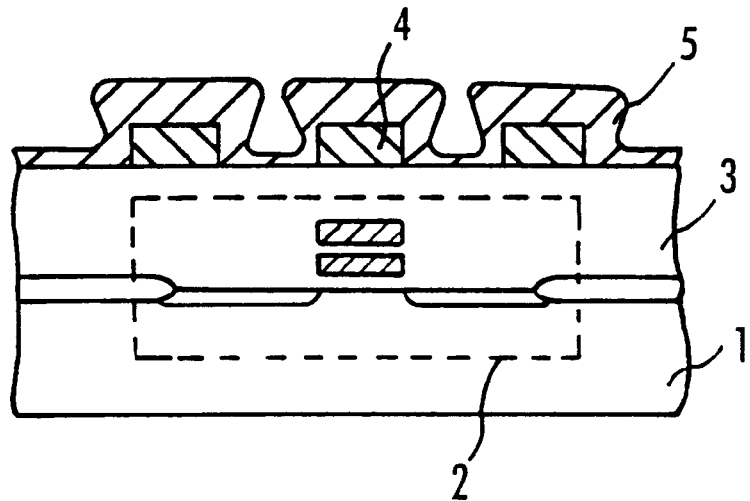
FIG. 4  *PRIOR ART*
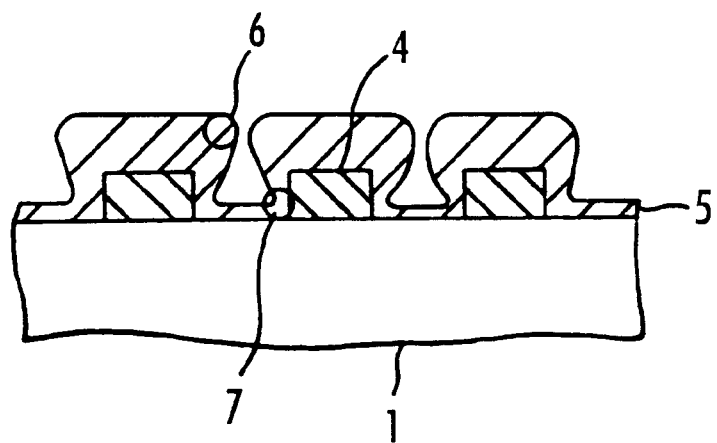

SEMICONDUCTOR DEVICE AND A PROCESS FOR FORMING A PROTECTIVE INSULATING LAYER THEREOF

This application is a divisional of application Ser. No. 08/827,555 filed Mar. 28, 1997 is now U.S. Pat. No. 5,880 518.

TECHNICAL FIELD

The present invention relates to a semiconductor device and its manufacturing process, the device having a protective insulating film deposited on a semiconductor element or a lead layer on a semiconductor substrate.

BACKGROUND ART

In a semiconductor device, semiconductor elements are formed on a semiconductor substrate, and thereafter a lead layer or a wiring layer is formed to electrically connect these semiconductor elements to each other. Further, the surfaces of these semiconductor elements and the lead layer are covered with a protective insulating film so that the elements and the layer are not influenced by external environmental effects such as moisture or stress, and then the semiconductor device is packaged in a mold resin or ceramic package.

For such a protective insulating film, frequently used is a silicon nitride film which has an extremely small moisture permeability and a high mechanical strength compared to those of a silicon oxide film. The silicon nitride film is formed by a chemical vapor deposition process in a plasma (hereafter referred to as a P-CVD process) with silane ($SiH_4$) and ammonia ($NH_3$) as main component gases, and has a refractive index of about 1.90 to 2.10.

However, during the process for forming the silicon nitride film, hydrogen contained in the component gases is not completely removed but remains in the film. Therefore, the film contains much hydrogen. For example, the silicon nitride film has six times more hydrogen concentration than a silicon oxide film which is formed by a chemical vapor deposition process in a plasma with silane ($SiH_4$) and nitrous oxide ($N_2O$) as main component gases, and has a refractive index of about 1.53 to 1.59.

The hydrogen in the above silicon nitride film is easily liberated by a low-temperature heat treatment. Therefore, in a relatively low temperature heat treatment at 300 to 400° C. for 10 to 60 minutes performed for recovery from plasma damage after formation of a protective insulating film, the hydrogen easily reaches the vicinity of a semiconductor element by diffusion. As a result, the hydrogen deteriorates the characteristics of sensitive semiconductor elements such as electrically-erasable nonvolatile memory elements (hereafter referred to as EEPROM elements).

As described above, a silicon nitride film is superior in moisture resistance and mechanical strength. However, since the film contains much hydrogen, it cannot be used as a protective insulating film for a sensitive element such as an EEPROM.

FIG. 3 is a sectional view showing the structure of a conventional EEPROM device. In FIG. 3, the device includes a semiconductor substrate 1 (hereafter referred to as substrate) made of single crystal silicon, an EEPROM element 2 formed on the substrate 1, an interlayer insulating film 3 made of a BPSG film formed on the whole surface of the EEPROM element 2, a lead layer or wiring 4 made of aluminum formed on the interlayer insulating film 3, and a silane-based silicon oxide film 5 serving as a protective insulating film formed to wholly cover the surfaces of the EEPROM element 2 and the lead layer 4. The silane-based silicon oxide film 5 is formed up to a thickness of about 1.2 $\mu$m by a P-CVD process with silane ($SiH_4$) and nitrous oxide ($N_2O$) as main component gases, and has a refractive index of about 1.53 to 1.59.

As described above, a conventional EEPROM device employs a silane-based silicon film 5 formed by the P-CVD process as a protective insulating film. However, the silane-based silicon film 5 has a low step coverage characteristic because it is formed mainly in a vapor phase. Therefore, as shown in FIG. 4, the silane-based silicon film 5 causes an overhang shape 6 to develop at an end of the lead layer 4, and its thickness decreases between lead layers 4, particularly at a stepped portion 7.

Further, the silane-based silicon film 5 is inferior to a silicon nitride film stated above in mechanical strength and in blocking characteristic for permeation of moisture or the like. Therefore, problems arise in that the quality of the silane-based silicon oxide film 5 deteriorates at the stepped portion 7 having reduced thickness. Thus, moisture permeates through this portion to reach the lower-laying interlayer insulating film 3, which causes imperfect insulation of the interlayer insulating film 3 and current leakage between lead layers 4.

DISCLOSURE OF THE INVENTION

The present invention is made to solve the above problems, and its object is to provide a very reliable semiconductor device having a protective insulating film with a preferable step coverage and a low permeability of moisture, preventing undesirable effects in a sensitive element such as an EEPROM element.

According to one aspect of the present invention, a semiconductor device comprises a semiconductor substrate, at least one semiconductor element formed on the semiconductor substrate, an interlayer insulating film formed on the semiconductor substrate, an interlayer insulating film formed on the semiconductor element, a lead layer including a plurality of electrical leads formed on the interlayer insulating film, and a protective insulating layer formed to cover the lead layer. The protective insulating film includes a plurality of layers, with a lowermost layer made of an organic-silane-based silicon oxide film and an upper layer made of a silane-based silicon oxide film containing excess silicon.

In another aspect of the present invention, in the semiconductor device, the silane-based silicon oxide layer containing excess silicon is disposed at an uppermost layer of the protective insulating film.

In another aspect of the present invention, in the semiconductor device, the organic silane-based silicon oxide film is formed by a chemical vapor deposition process in plasma with a organic silane and oxygen as main component gases.

In another aspect of the present invention, in the semiconductor device, the silane-based silicon oxide film containing excess silicon is formed by a chemical vapor deposition process in a plasma with silane and nitrous oxide as main component gases.

In another aspect of the present invention, in the semiconductor device, the silane-based silicon oxide film contains silicon in an amount greater than in the stoichiometric composition (O/Si=2.00).

In another aspect of the present invention, in the semiconductor device, the silane-based silicon oxide film has a refractive index of 1.59 to 1.66.

In another aspect of the present invention, in the semiconductor device, the semiconductor element is an electrically-erasable nonvolatile memory element.

According to another aspect of the present invention, in a process for forming a protective insulating layer in a semiconductor device, an organic-silane-based silicon oxide film is formed, on at least a semiconductor device element, by a chemical vapor deposition process in a plasma using a organic silane and oxygen as main component gases. Further, a silane-based silicon oxide film containing excessive silicon is formed, above said organic-silane-based silicon oxide film, by a chemical vapor deposition process in a plasma using silane and nitrous oxide as main component gases.

In another aspect of the present invention, in the process for forming a protective insulating layer in a semiconductor device, an excess amount of silane gas and deficient amount of nitrous oxide gas are used for forming the silane-based silicon oxide film.

Other features and advantages of the present invention will become more apparent from the following description taken together with the accompanying drawings.

BRIEF DESCRIPTION OF DRAWINGS

FIG. 3 and FIG. 4 are cross-sectional views showing the structure of a conventional EEPROM device.

BEST MODE FOR CARRYING OUT THE INVENTION

The invention will now be described in further detail by way of example with reference to the accompanying drawings.

Figure 1:
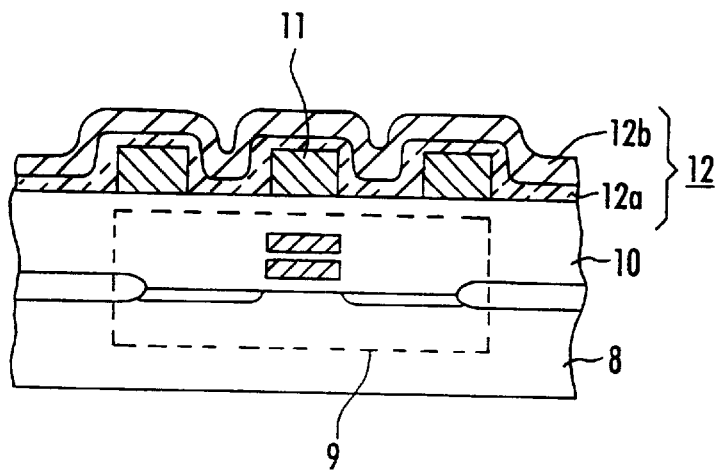
FIG. 1 is a cross-sectional view showing a structure of an EEPROM device according to an embodiment of the present invention.

FIG. 1 is a sectional view showing the structure of an EEPROM device according to an embodiment of the present invention. In FIG. 1, the device includes a semiconductor substrate 8 (hereafter referred to as substrate) made of single crystal silicon or the like, an EEPROM element 9 formed on the substrate 8, an interlayer insulating film 10 made of a BPSG film or the like formed on the whole surface of the EEPROM element 9, a lead layer or wiring layer 11 made of aluminum or the like formed on the interlayer insulating film 10, and a protective insulating film 12 formed to cover the entire surfaces of the element 9 and the layer 11. In this embodiment, the protective insulating film 12 is composed of two layers. A lower layer portion is made of an organic-silane-based silicon oxide film 12a. An upper layer portion is made of a silane-based silicon oxide film 12b containing excess silicon compared to the stoichiometric composition (O/Si=2.00) (hereafter referred to as a silicon-excess oxide film).

In the structure of this embodiment, a preferable step coverage of a lead layer 11 is obtained by the organic-silane-based silicon oxide film 12a. Therefore, the silicon-excess oxide film 12b is formed on a smoothly formed underlying layer 12a, so that the overall film quality is not deteriorated at the stepped portions 13 of a lead layer 11. Thus, the protective insulating film 12 of high reliability is obtained which is superior in moisture resistance. Accordingly, the characteristics of the element or the device are prevented from deteriorating due to hydrogen, and the reliability of the semiconductor device is improved.

Figure 2A:
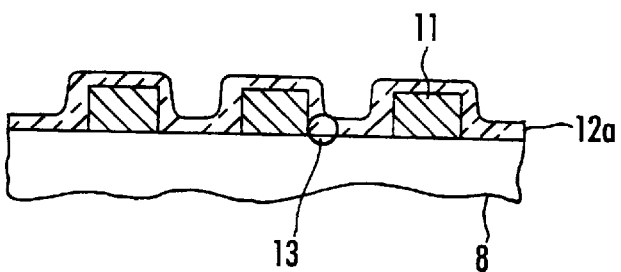
FIG. 2(a) and FIG. 2(b) show cross-sectional views in process for forming a protective insulating film on a semiconductor device.

Next, a process for forming the protective insulating film 12 of the EEPROM device as above is described below with reference to FIG. 2(a) and FIG. 2(b).

The organic-silane-based silicon oxide film 12a is deposited to a thickness of 0.3 to 0.6 μm by a P-CVD process using tetraethoxysilane (hereafter referred to as TEOS) and oxygen as main component gases. The organic-silane-based silicon oxide film 12a is mainly formed by a chemical vapor phase reaction on the surface of the substrate 8, so that a preferable step coverage is obtained. Accordingly, as shown in FIG. 2(a), stepped portions 13 and portions between lead layers 11 are covered at a sufficient film thickness, and particularly the stepped portions 13 are smoothly covered.

Figure 2B:
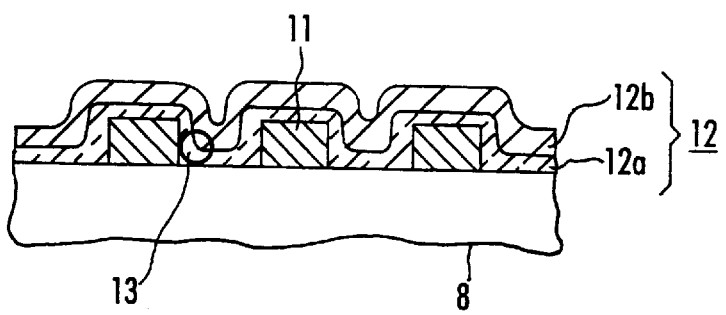

Then, as shown in FIG. 2(b), the silicon-excess oxide film 12b is deposited on the organic-silane-based silicon oxide film 12a in a state such that silicon is contained in a much greater amount than in the stoichiometric composition (O/Si=2.00) by a P-CVD process using silane ($SiH_4$) and nitrous oxide ($N_2O$) as main component gases. The silicon-excess oxide film 12b is deposited to a thickness of 0.7 to 1.0 μm so that the thickness of the protective insulating film 12 including the thickness of the underlying organic-silane-based silicon oxide film 12a totals to about 1.3 μm. As for the film forming conditions in this process, the film forming temperature is set to about 300 to 400° C., the silane gas flow rate is set to about 145 to 185 sccm, and the nitrous oxide gas flow rate is set to about 900 to 1,400 sccm. The amount of silicon in the film is increased by increasing the silane gas flow rate or decreasing the nitrous oxide gas flow rate. Further, the silicon composition ratio (O/Si) in the silicon oxide film is related with the refractive index of a film, and it is preferable to form a film having a refractive index of about 1.59 to 1.66.

The silicon-excess oxide film 12b contains much more silicon than in the stoichiometric composition. Accordingly, the amount of dangling bonds of the silicon is increased in the film. Because the dangling bonds have a function of trapping hydrogen and moisture, they prevents hydrogen and moisture from diffusing or permeating to a lower layer and prevents undesirable influences. Thus, by forming the silicon-excess oxide film 12b on the upper layer portion of the protective insulating film 12, a structure of the protective insulating film 12 superior in moisture resistance with a high blocking characteristic for permeation of moisture from the outside is obtained.

Further, the hydrogen content in the film is extremely low compared to that of a silicon nitride film. In addition, the silicon-excess oxide film 12b traps hydrogen liberated in the film or hydrogen diffused from the outside, so that the influence of hydrogen on underlying EEPROM elements is reduced.

Furthermore, the mechanical strength of the silicon-excess oxide film 12b is increased by containing excess silicon compared to a normal silane-based oxide film. Therefore, by forming the silicon-excess oxide film 12b on the upper layer portion of the protective insulating film 12, resistance to stress received from a mold resin is improved when the film is sealed by a mold resin or the like in a subsequent process.

As for the protective insulating film 12b, the silicon-excess film having a refractive index of about 1.59 to 1.66 is preferable as described above. The reason is as follows. If the refractive index of silicon-excess oxide film is lower than the range of about 1.59 to 1.66, the number of dangling bonds in the film is not sufficiently increased, and the effect of trapping hydrogen and moisture cannot be sufficiently obtained. If the refractive index is higher than that range, the film stress increases, resulting in deteriorated reliability.

Thus, in the case of this embodiment, the stepped portions 13 and the portions between lead layers 11 are smoothly covered by the organic-silane-based silicon oxide film 12a having a suitable step coverage at the lower layer portion of the protective insulating film 12. Thereafter, a silicon-excess oxide film 12b superior in moisture resistance is formed at the upper layer portion. Thereby, the silicon-excess oxide film 12b itself is formed on a smoothly formed underlying layer, so that film quality is not deteriorated at the stepped portions 13 of the lead layer 11, in contrast to the conventional case. That is, the silicon-excess oxide film 12b itself is superior in moisture resistance, and in addition, it is formed on the organic-silane-based silicon oxide film 12a having a preferable step coverage. Therefore, the problem of deterioration of the film quality at the stepped portions 13 is solved, and permeation of moisture from the deteriorated portion is avoided.

Thus, by forming the organic-silane-based silicon oxide film 12a at a lower layer and the silicon-excess oxide film 12b as an upper layer, a protective insulating film 12 of high reliability is obtained which is superior in moisture resistance with a preferable step coverage preventing undesirable influence due to moisture or hydrogen to the lower layer, and which has improved resistance to external stress.

Further, in this embodiment, each layer of the protective insulating film 12 is formed by the P-CVD process. Since the P-CVD process is performed at a relatively low temperature, reliability of the underlying lead layer 11 can be secured. In this case, the organic-silane-based silicon oxide film 12a at the lower layer portion is formed by the P-CVD process an organic silane and oxygen. Alternatively, the film 12a can be formed by using ozone instead of oxygen. However, such an advantage is not obtained in the P-CVD process, and further, decomposition is necessitated to control ozone. Therefore, it is preferable to form the organic-silane-based silicon oxide film 12a having a preferable step coverage and securing the reliability of the underlying lead layer 11 by the P-CVD process using easily handled oxygen and organic silane.

In the case of the above embodiment, TEOS is used to form the organic-silane-based silicon oxide film 12a. However, the same advantage can be obtained by using other types of organic silane such as dimethylethoxy-silane or tetramethoxysilane.

Further, the above embodiment is implemented in an EEPROM. However, the present invention can also be applied to a semiconductor device having a sensitive element which is easily influenced by hydrogen in memory storage, such as another type of ROM element.

The organic-silane-based silicon oxide film 12a as explained in the previous embodiment may be formed by the P-CVD process an organic silane and oxygen as main component gases and by using two values of high frequency. For example, the organic-silane-based silicon oxide film 12a may be formed with a preferable step coverage by a P-CVD process using two values of high frequencies of 13.56 MHz and 350–430 kHz.

Further, it is possible to form the organic-silane-based silicon oxide film 12a with a preferable step coverage by the P-CVD process using ECR discharge.

Furthermore, the silicon-excess oxide film 12b may be formed at an upper layer portion of the protective insulating film 12 by a P-CVD process using silane and nitrous oxide as main component gates and using two values of high frequency or by a P-CVD process using ECR discharge. In this case too, the silicon-excess oxide film 12, superior in moisture resistance, is formed similarly as in the previous embodiment.

In the case of the previous embodiment, the protective insulating film 12 is comprised of the organic-silane-based silicon oxide film 12a and the silicon-excessive oxide film 12b. However, it is also possible to form a protective insulating film 12 as a laminate film made of three or more layers including another layer or layers between the organic-silane-based silicon oxide film 12a and the silicon-excessive oxide film 12b. The intermediate layer may be a film such as a silane-based silicon oxide film or the like with a refractive index of about 1.53 to 1.59 formed by the P-CVD process using silane and nitrous oxide as main component gases.

Also in this case, the stepped portions 13 and the portions between lead layers 11 may be smoothly and preferably covered by forming an organic-silane-based silicon oxide film 12a with a preferable step coverage at the lowermost layer. Therefore, the quality of a film formed on the film 12a is prevented from deterioration. Further, permeation of moisture from the outside is prevented, and resistance to external stress is improved, by forming the silicon-excess oxide film 12b of superior moisture resistance at the uppermost layer. Thus, a high-reliability protective insulating film 12 is obtained which prevents undesired influences of hydrogen on an EEPROM element, similarly as in the previous embodiment.

As described above in detail, according to the present invention, a lowermost layer of a protective insulating film is constituted with an organic-silane-based silicon oxide film formed by a P-CVD process using organic silane and oxygen, and an uppermost layer of the protective insulating film is constituted with a silane-based silicon in an amount oxide film containing silicon much greater than in the stoichiometric composition and formed by the P-CVD. As a result, a protective insulating film is obtained having a preferable step coverage, superior moisture resistance, capable of preventing undesirable influences of hydrogen and moisture on a lower layer, and further having increased resistance to external stress. Thus, the reliability of a semiconductor device is improved.

Further, according to the present invention, a silane-based silicon oxide film with a refractive index of about 1.59 to 1.66 is formed as the film constituting the uppermost layer of a protective insulating film. Thus, a silane-based silicon oxide film is obtained reliably and securely which contains excess silicon and is superior in moisture resistance, and the above advantages are achieved.

Furthermore, according to the present invention, the protective insulating film is formed as a two-layer structure. Thus, a protective insulating film having the above advantages is easily formed, and a reliable semiconductor device is obtained.

Furthermore, according to the present invention, a superior protective insulating film is applied to a semiconductor device such as an electrically-erasable nonvolatile memory element device. Thus, the characteristics of the element or the device are prevented from deteriorating due to hydrogen, and the reliability of the semiconductor device is improved.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A process for manufacturing a semiconductor device comprising the steps of:

forming, on at least a semiconductor device element and/or at least one lead layer on a semiconductor substrate, a lower layer of an organic-silane-based silicon oxide film, having a thickness of 0.3 to 0.6 μm, by a chemical vapor deposition process in plasma using organic silane and oxygen as main component gases; and forming, above said organic-silane-based silicon oxide film, an upper layer of a silane-based silicon oxide film containing excessive silicon, having a thickness of 0.7 to 1.0 μm, by a chemical vapor deposition process in plasma using silane and nitrous oxide as main component gases;

wherein said lower layer of an organic-silane-based silicon oxide film and said upper layer of a silane-based silicon oxide film containing excessive silicon constitutes a protective insulating layer covering said semiconductor device element and/or said lead layer.

2. The process for forming a semiconductor device according to claim 1, wherein said upper layer of a silane-based silicon oxide film containing excessive silicon is formed by excessive silane gas and deficient nitrous oxide gas.

3. The process for forming a semiconductor device according to claim 1, wherein said protective insulating layer, including said lower layer of an organic-silane-based silicon oxide film and said upper layer of a silane-based silicon oxide film containing excessive silicon, is formed to have a thickness of about 1.3 μm.

4. The process for forming a semiconductor device according to claim 1, wherein at least one of said chemical vapor deposition process is carried out in plasma by two different high frequencies.

5. The process for forming a semiconductor device according to claim 1, wherein at least one of said chemical vapor deposition process is carried out in plasma by ECR discharge.

6. A process for manufacturing a semiconductor device comprising the steps of:

forming at least one semiconductor element on a semiconductor substrate;

forming an interlayer insulating film on said semiconductor element;

forming at least one lead layer including a plurality of electrical leads on said interlayer insulating film;

forming a lower layer an organic-silane-based silicon oxide film having a thickness of 0.3 to 0.6 μm on said lead layer, forming an upper layer of a silane-based silicon oxide film containing excess silicon having thickness of 0.7 to 1.0 μm on or above said lower layer of an organic-silane-based silicon oxide film;

wherein said lower layer of an organic-silane-based silicon oxide film and said upper layer of a silane-based silicon oxide film constitutes a protective insulating layer having a thickness of about 1.3 μm to cover all of said lead layer or layers.

7. The process for manufacturing a semiconductor device according to claim 6, wherein said silane-based silicon oxide layer containing excess silicon is disposed as an uppermost layer of said protective insulating film.

8. The process for manufacturing a semiconductor device according to claim 6, wherein said organic-silane-based silicon oxide film is formed by a chemical vapor deposition process in a plasma with an organic silane and oxygen as main component gases.

9. The process for manufacturing a semiconductor device according to claim 6, wherein said silane-based silicon oxide film containing excess silicon is formed by a chemical vapor deposition process in a plasma with silane and nitrous oxide as main component gases.

10. The process for manufacturing a semiconductor device according to claim 6, wherein said silane-based silicon oxide film is formed to contain silicon in an amount more than in the stoichiometric composition (O/Si–2.00).

11. The process for manufacturing a semiconductor device according to claim 6, wherein said silane-based silicon oxide film is formed to have a refractive index of 1.59 to 1.66.

12. The process for manufacturing a semiconductor device according to claim 6, wherein said at least one semiconductor element is an electrically-erasable nonvolatile memory element.

13. A process for manufacturing a semiconductor device comprising the steps of:

forming at least one semiconductor element on a semiconductor substrate;

forming an interlayer insulating film on said semiconductor element;

forming a lead layer including a plurality of electrical leads on said interlayer insulating film;

forming a lower layer an organic-silane-based silicon oxide film having a thickness of 0.3 to 0.6 μm on said lead layer, forming an upper layer of a silane-based silicon oxide film containing excess silicon having thickness of 0.7 to 1.0 μm on or above said lower layer of an organic-silane-based silicon oxide film;

wherein said lower layer of an organic-silane-based silicon oxide film and said upper layer of a silane-based silicon oxide film constitutes a protective insulating layer having a thickness of about 1.3 μm to cover said lead layer.

14. The process for manufacturing a semiconductor device according to according to claim 13, wherein said silane-based silicon oxide layer containing excess silicon is disposed as an uppermost layer of said protective insulating film.

15. The process for manufacturing a semiconductor device according to claim 13, wherein said organic-silane-based silicon oxide film is formed by a chemical vapor deposition process in a plasma with an organic silane and oxygen as main component gases.

16. The process for manufacturing a semiconductor device according to claim 13, wherein said silane-based silicon oxide film containing excess silicon is formed by a chemical vapor deposition process in a plasma with silane and nitrous oxide as main component gases.

17. The process for manufacturing a semiconductor device according to claim 13, wherein said silane-based silicon oxide film is formed to contain silicon in an amount more than in the stoichiometric composition (O/Si–2.00).

18. The process for manufacturing a semiconductor device according to claim 13, wherein said silane-based silicon oxide film is formed to have a refractive index of 1.59 to 1.66.

19. The process for manufacturing a semiconductor device according to claim 13, wherein said at least one semiconductor element is an electrically-erasable nonvolatile memory element.

* * * * *